(12) United States Patent
Gupta et al.

(10) Patent No.: US 11,456,173 B2
(45) Date of Patent: Sep. 27, 2022

(54) METHODS FOR MODIFYING PHOTORESIST PROFILES AND TUNING CRITICAL DIMENSIONS

(71) Applicant: Applied Materials, Inc., Santa Clara, CA (US)

(72) Inventors: Meenakshi Gupta, San Jose, CA (US); Rui Cheng, Santa Clara, CA (US); Srinivas Guggilla, San Jose, CA (US); Karthik Janakiraman, San Jose, CA (US); Diwakar N. Kedlaya, San Jose, CA (US); Zubin Huang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 185 days.

(21) Appl. No.: 16/797,111

(22) Filed: Feb. 21, 2020

(65) Prior Publication Data

US 2020/0321210 A1 Oct. 8, 2020

Related U.S. Application Data

(60) Provisional application No. 62/830,759, filed on Apr. 8, 2019.

(51) Int. Cl.
*H01L 21/027* (2006.01)
*H01L 21/02* (2006.01)
*H01L 21/32* (2006.01)

(52) U.S. Cl.
CPC .... *H01L 21/0273* (2013.01); *H01L 21/02274* (2013.01); *H01L 21/32* (2013.01)

(58) Field of Classification Search
CPC .......... H01L 21/0273; H01L 21/02274; H01L 21/32; H01L 21/02271

(Continued)

(56) References Cited

U.S. PATENT DOCUMENTS

| 5,950,925 A | 9/1999 | Fukunaga et al. |
| 6,245,192 B1 | 6/2001 | Dhindsa et al. |

(Continued)

FOREIGN PATENT DOCUMENTS

| KR | 20060106104 A | 10/2006 |
| KR | 20110014989 A | 2/2011 |
| WO | 2005059200 A1 | 6/2005 |

OTHER PUBLICATIONS

International Search Report and Written Opinion dated Jun. 24, 2020 for Application No. PCT/US2020/019151.

*Primary Examiner* — Duy Vu N Deo
(74) *Attorney, Agent, or Firm* — Patterson + Sheridan, LLP (57) ABSTRACT

Embodiments for processing a substrate are provided and include a method of trimming photoresist to provide photoresist profiles with smooth sidewall surfaces and to tune critical dimensions (CD) for the patterned features and/or a subsequently deposited dielectric layer. The method can include depositing a sacrificial structure layer on the substrate, depositing a photoresist on the sacrificial structure layer, and patterning the photoresist to produce a crude photoresist profile on the sacrificial structure layer. The method also includes trimming the photoresist with a plasma to produce a refined photoresist profile covering a first portion of the sacrificial structure layer while a second portion of the sacrificial structure layer is exposed, etching the second portion of the sacrificial structure layer to form patterned features disposed on the substrate, and depositing a dielectric layer on the patterned features.

19 Claims, 4 Drawing Sheets

(58) Field of Classification Search
USPC .................................. 438/270, 700–744
See application file for complete search history.

(56) References Cited

U.S. PATENT DOCUMENTS

| | | | |
|---|---|---|---|
| 6,379,466 B1 | 4/2002 | Sahin et al. | |
| 8,277,670 B2 | 10/2012 | Heo et al. | |
| 10,079,154 B1* | 9/2018 | Le .................... | H01L 21/31116 |
| 2003/0010451 A1 | 1/2003 | Tzu et al. | |
| 2003/0132319 A1 | 7/2003 | Hytros et al. | |
| 2003/0136520 A1 | 7/2003 | Yudovsky et al. | |
| 2003/0172872 A1 | 9/2003 | Thakur et al. | |
| 2005/0003310 A1 | 1/2005 | Bai et al. | |
| 2006/0228895 A1 | 10/2006 | Chae et al. | |
| 2008/0299776 A1* | 12/2008 | Bencher ............ | H01L 21/31144 438/703 |
| 2009/0286400 A1 | 11/2009 | Heo et al. | |
| 2010/0291771 A1* | 11/2010 | Zhou ................. | H01L 21/31116 438/710 |
| 2011/0300711 A1* | 12/2011 | Martin .................. | G03F 7/40 438/696 |
| 2012/0318773 A1 | 12/2012 | Wu et al. | |
| 2013/0048605 A1 | 2/2013 | Sapre et al. | |
| 2015/0221541 A1 | 8/2015 | Nemani et al. | |
| 2016/0300709 A1 | 10/2016 | Posseme et al. | |
| 2017/0076968 A1 | 3/2017 | Wang et al. | |
| 2017/0084425 A1 | 3/2017 | Uziel et al. | |
| 2018/0261516 A1 | 9/2018 | Lin et al. | |
| 2018/0261686 A1 | 9/2018 | Lin et al. | |
| 2018/0329189 A1 | 11/2018 | Banna et al. | |
| 2018/0339314 A1 | 11/2018 | Bhoyar et al. | |
| 2018/0351164 A1 | 12/2018 | Hellmich et al. | |
| 2018/0358229 A1 | 12/2018 | Koshizawa et al. | |
| 2019/0019690 A1 | 1/2019 | Choi et al. | |
| 2019/0032194 A2 | 1/2019 | Dieguez-Campo et al. | |
| 2019/0079388 A1 | 3/2019 | Fender et al. | |
| 2019/0088543 A1 | 3/2019 | Lin et al. | |
| 2019/0130731 A1 | 5/2019 | Hassan et al. | |
| 2019/0287808 A1 | 9/2019 | Goradia et al. | |
| 2019/0311900 A1 | 10/2019 | Pandit et al. | |
| 2019/0311909 A1 | 10/2019 | Bajaj et al. | |
| 2019/0382879 A1 | 12/2019 | Jindal et al. | |
| 2020/0027767 A1 | 1/2020 | Zang et al. | |
| 2020/0043722 A1 | 2/2020 | Cheng et al. | |

\* cited by examiner

METHODS FOR MODIFYING PHOTORESIST PROFILES AND TUNING CRITICAL DIMENSIONS

CROSS-REFERENCE TO RELATED APPLICATIONS

This application claims benefit of U.S. application Ser. No. 62/830,759, filed on Apr. 8, 2019, which is herein incorporated by reference.

BACKGROUND

Field

Embodiments of the present disclosure generally relate to methods for semiconductor processing. Specifically, embodiments of the present disclosure relate to methods for trimming photoresist layers and depositing conformal dielectric films.

Description of Related Art

Dielectric layers have been used for applications such as barrier layers or spacers in the fabrication of modern semiconductor devices. The dielectric layers can be deposited over features, e.g., trenches or vias, in a patterned substrate using a deposition process, such as atomic layer deposition (ALD) or chemical vapor deposition (CVD). The dielectric layers are then anisotropically etched to form spacers on either side of the features. While methods of depositing spacers using ALD process can provide conformal layers over the features due to the self-limiting nature of the ALD process, it has been challenging to form highly conformal dielectric layers across the patterned substrate and blanket substrate with zero pattern loading using CVD processes due to the related reaction mechanisms.

With scaling of the features, the desired critical dimension (CD) target can be challenging due to limitations of 193 immersion lithography. To achieve the CD target and desired profile, multiple patterning techniques like self-aligned double patterning (SADP) and self-aligned quadruple patterning (SAQP) are in use for various applications to build leading edge semiconductor devices. Photoresist (PR) patternings can be accomplished in several ways. In a traditional process of record (POR) approach, the pattern is transferred to the underneath hard mask either using Litho-Etch-Litho-Etch (LELE) or Litho-Freeze-Litho-Etch (LFLE). In another approach, self-aligned multiple patterning processes are used in which hard mask is patterned with PR and conformal spacer is deposited on photoresist or spin on carbon, commonly known as mandrel. Self-aligned multiple patterning techniques are cost effective as compare to traditional patterning techniques owing to the elimination of the litho step, which is an expensive step in the fabrication of semiconductor devices.

During PR exposure and development, the PR profile is not smooth along the side walls and is typically very wavy and rough. Such non-smooth profiles transfer to the subsequently deposited films, such as the deposition of the conformal spacer. That is, the conformal spacer will follow the same shape or profile as the underlying PR layer and take on similar wavy and rough surfaces. After spacer etch back and PR mandrel removal, spacer sidewalls will also be very rough and transferable pattern will induce lot of CD variations in the device and line width roughness issues.

Therefore, there is a need for a method of trimming photoresist to provide profiles with a modified, smooth surface and to tune critical dimensions. There is also a need for depositing dielectric layers in high aspect ratio trenches with reduced pattern loading.

SUMMARY

Embodiments for processing a substrate are provided and include a method of trimming photoresist to provide photoresist profiles with smooth sidewall surfaces and to tune or modulate critical dimensions (CD) for the patterned features and/or a subsequently deposited dielectric layer.

In one or more embodiments, the method includes depositing a sacrificial structure layer on the substrate, depositing a photoresist on the sacrificial structure layer, and patterning the photoresist to produce a crude photoresist profile on the sacrificial structure layer. The method also includes trimming the photoresist with a plasma to produce a refined photoresist profile covering a first portion of the sacrificial structure layer while a second portion of the sacrificial structure layer is exposed, etching the second portion of the sacrificial structure layer to form patterned features disposed on the substrate, and depositing a dielectric layer on the patterned features. In some embodiments, the refined photoresist profile has a line width roughness of about 10 Å to about 20 Å and a line edge roughness of about 10 Å to about 20 Å. In other embodiments, the trimming of the photoresist and the depositing of the dielectric layer can occur in the same processing chamber, such as a PE-CVD chamber.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments for processing a substrate are provided and include a method of trimming photoresist to provide photoresist profiles with smooth sidewall surfaces and to tune or modulate critical dimensions (CD) for the patterned features and/or a subsequently deposited dielectric layer. The method can include depositing a sacrificial structure layer on the substrate, depositing a photoresist on the sacrificial structure layer, and patterning the photoresist to produce a crude photoresist profile on the sacrificial structure layer. The method also includes trimming the photoresist with a plasma to produce a refined photoresist profile covering a first portion of the sacrificial structure layer while a second portion of the sacrificial structure layer is exposed, etching the second portion of the sacrificial structure layer to form patterned features disposed on the substrate, and depositing a dielectric layer on the patterned features. In some examples, trimming the photoresist and depositing the dielectric layer occur in the same processing chamber, such as a plasma-enhanced chemical vapor deposition (PE-CVD) chamber.

Exemplary systems and/or chambers that may be used to practice embodiments of the present disclosure may include any suitable thin film deposition system. Examples of suitable systems include the CENTURA® systems which may use a DxZ™ processing chamber, PRODUCER HARP™ processing chamber, PRECISION 5000® systems, PRODUCER™ systems, PRODUCER GT™ processing chamber, PRODUCER SE™ processing chamber, PRODUCER™ CVD processing chamber, PRODUCER SACVD™ processing chamber, and PRODUCER® XP PRECISION™ CVD processing chamber, which are commercially available from Applied Materials, Inc., of Santa Clara, Calif. Other tools capable of performing PE-CVD processes may also be adapted to benefit from the embodiments described herein. In addition, any system enabling the PE-CVD processes described herein can be used to advantage. In one or more embodiments, a remote plasma system (RPS) can be in fluid communication with any processing chamber and utilize during methods described and discussed herein. The apparatus description described herein is illustrative and should not be construed or interpreted as limiting the scope of the embodiments described herein. The process may be performed on any substrate, such as a 200 mm, 300 mm, or 450 mm substrate or other medium suitable for semiconductor processing.

Figure 1:
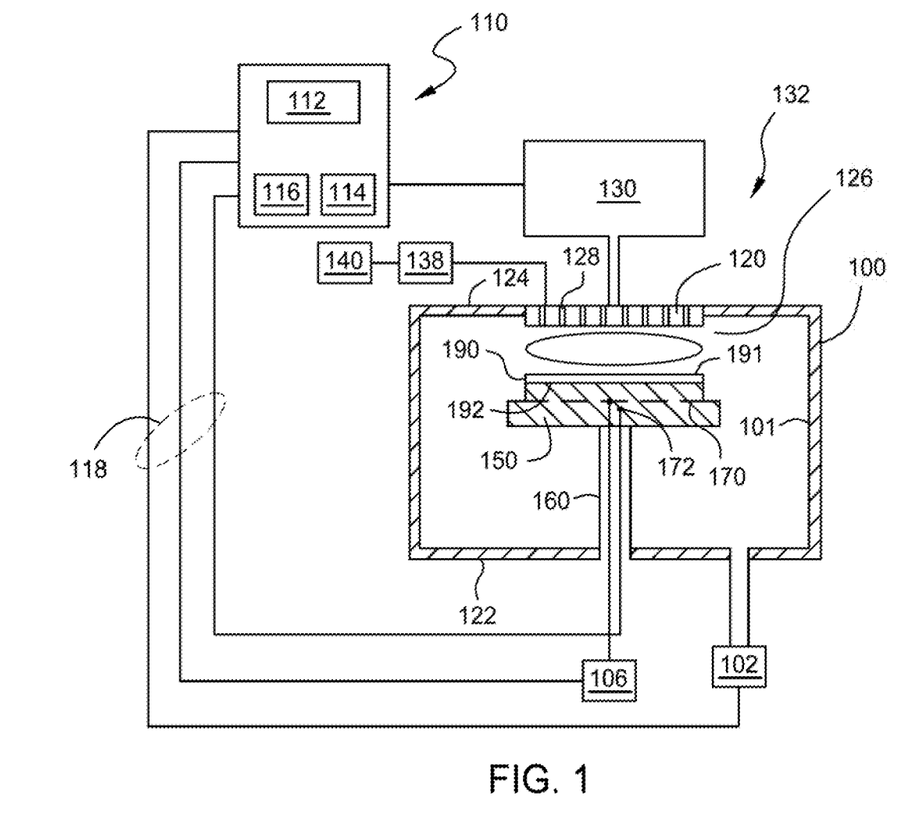
FIG. 1 depicts a schematic illustration of a substrate processing system that can be used to perform methods in accordance with one or more embodiments described and discussed herein.

FIG. 1 depicts a schematic illustration of a substrate processing system 132 that can be used to perform methods in accordance with embodiments described and discussed herein. The substrate processing system 132 includes a processing chamber 100 coupled to a gas panel 130 and a controller 110. The processing chamber 100 generally includes a top 124, a side 101 and a bottom wall 122 that define an interior processing volume 126. A support pedestal 150 for supporting a substrate 190 is positioned in the interior processing volume 126 of the processing chamber 100. The support pedestal 150 is supported by a stem 160 and can be fabricated from aluminum, ceramic, and other suitable materials such as stainless steel. The support pedestal 150 may be moved in a vertical direction inside the processing chamber 100 using a displacement mechanism (not shown).

The support pedestal 150 may include an embedded heater element 170 suitable for controlling the temperature of the substrate 190 supported on a surface 192 of the support pedestal 150. The support pedestal 150 may be resistively heated by applying an electric current from a power supply 106 to the embedded heater element 170. The electric current supplied from the power supply 106 is regulated by the controller 110 to control the heat generated by the embedded heater element 170, thus maintaining the substrate 190 and the support pedestal 150 at a substantially constant temperature during film deposition. The supplied electric current may be adjusted to selectively control the temperature of the support pedestal 150.

The temperature of the support pedestal 150 can be about 30° C., about 40° C., about 50° C., about 80° C., about 100° C., about 150° C., about 200° C., about 250° C., about 300° C., or about 400° C. to about 450° C., about 500° C., about 600° C., about 700° C., about 800° C., or about 1,000° C. For example, the temperature of the support pedestal 150 can be about 30° C. to about 1,000° C., about 50° C. to about 1,000° C., about 50° C. to about 800° C., about 50° C. to about 700° C., about 50° C. to about 600° C., about 50° C. to about 550° C., about 50° C. to about 500° C., about 50° C. to about 400° C., about 100° C. to about 1,000° C., about 100° C. to about 800° C., about 100° C. to about 700° C., about 100° C. to about 600° C., about 100° C. to about 550° C., about 100° C. to about 500° C., about 100° C. to about 400° C., about 200° C. to about 1,000° C., about 200° C. to about 800° C., about 200° C. to about 700° C., about 200° C. to about 600° C., about 200° C. to about 550° C., about 200° C. to about 500° C., about 200° C. to about 400° C., about 400° C. to about 1,000° C., about 400° C. to about 800° C., about 400° C. to about 700° C., about 400° C. to about 600° C., or about 400° C. to about 500° C.

A temperature sensor 172, such as a thermocouple, may be embedded in the support pedestal 150 to monitor the temperature of the support pedestal 150. The measured temperature is used by the controller 110 to control the power supplied to the embedded heater element 170 to maintain the substrate 190 at a desired temperature.

A vacuum pump 102 is coupled to a port formed in the bottom of the processing chamber 100. The vacuum pump 102 is used to maintain a desired gas pressure in the processing chamber 100. The vacuum pump 102 also evacuates post-processing gases and by-products of the process from the processing chamber 100.

A gas distribution assembly 120 having a plurality of apertures 128 is disposed on the top of the processing chamber 100 above the support pedestal 150. The apertures 128 may have different sizes, number, distributions, shape, design, and diameters to facilitate the flow of the various process gases into the processing chamber 100. The gas distribution assembly 120 is connected to the gas panel 130 that allows various gases to supply to the interior processing volume 126 during process. Plasma is formed from the process gas mixture exiting the gas distribution assembly 120 to enhance thermal decomposition of the process gases resulting in the deposition of material on a surface 191 of the substrate 190.

The gas distribution assembly 120 and support pedestal 150 may form a pair of spaced apart electrodes in the interior processing volume 126. One or more RF power sources 140 may provide a bias potential through a matching network 138 to the gas distribution assembly 120 to facilitate generation of plasma between the gas distribution assembly 120 and the support pedestal 150. Alternatively, the RF power sources 140 and matching network 138 may be coupled to the gas distribution assembly 120, the support pedestal 150, or coupled to both the gas distribution assembly 120 and the support pedestal 150, or coupled to an antenna (not shown) disposed exterior to the processing chamber 100. In one or more embodiments, the RF power sources 140 can provide a power in a range from about 10 watts to about 3,000 watts at a frequency of about 50 kHz to about 13.6 MHz. In other embodiments, the RF power sources 140 can provide a power in a range from about 500 watts to about 1,800 watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general-purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the substrate processing system 132 are handled through numerous signal cables collectively referred to as signal buses 118.

Figure 2:
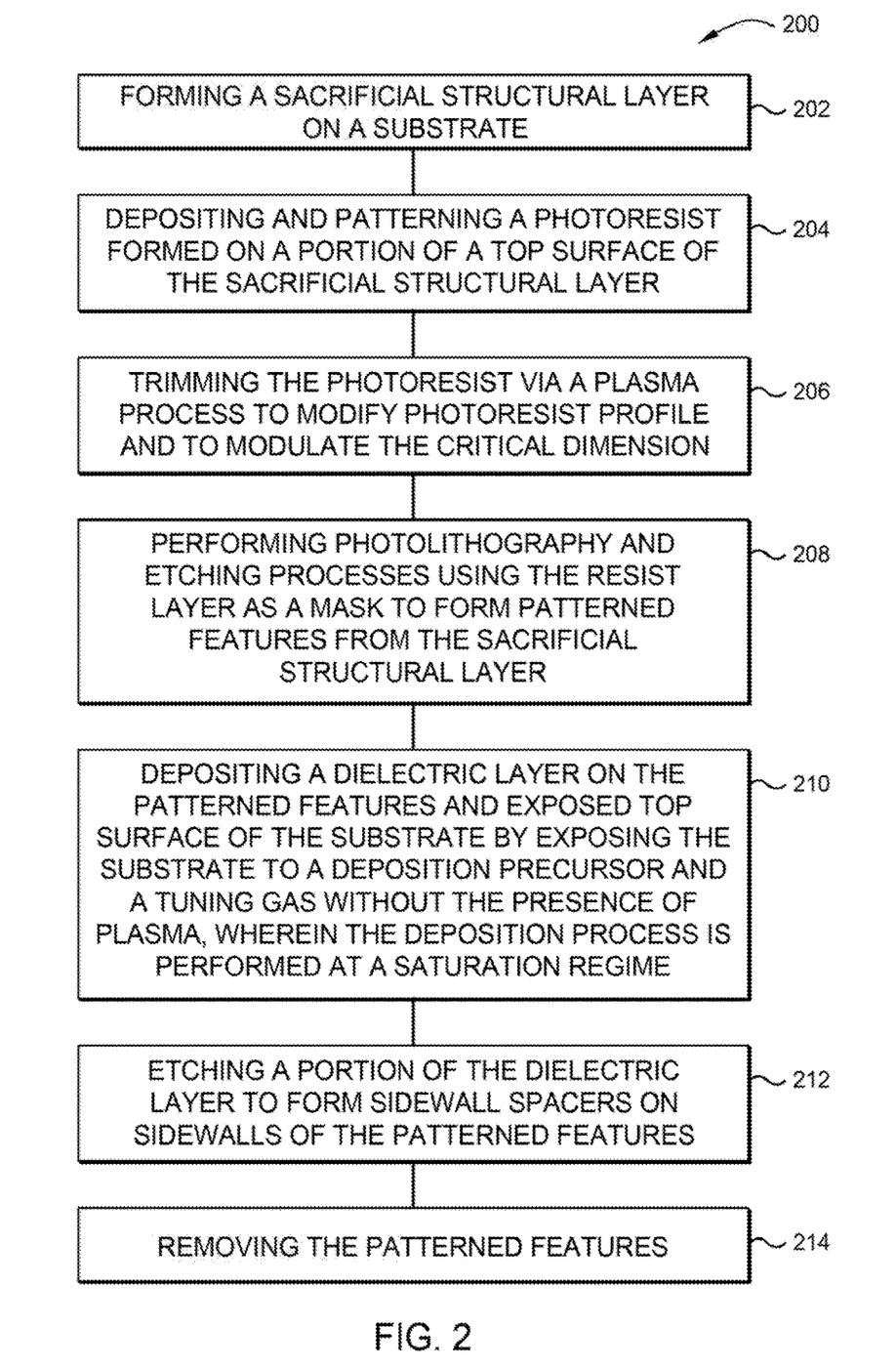
FIG. 2 depicts a flow chart of a process associated with an exemplary self-aligned double patterning (SADP) process in accordance with one or more embodiments described and discussed herein.

FIG. 2 is a flow chart of a process 200 associated with an exemplary self-aligned double patterning (SADP) process according to an embodiment of the present disclosure. FIGS. 3A-3G illustrate cross-sectional views of a structure formed by the process 200 depicted in FIG. 2. The self-aligned double patterning process is chosen for illustration purposes, and variations are contemplated. The concept of the disclosure is equally applicable to other deposition processes or patterning schemes, such as a self-aligned triple patterning (SATP) process, a self-aligned quadruple patterning (SAQP) process, a via/hole shrink process, a back end of line (BEOL), or any combination thereof, that may use a protective spacer or protective sacrificial layer, as needed in various semiconductor processes such as NAND flash application, DRAM application, or CMOS application.

Figure 3A:
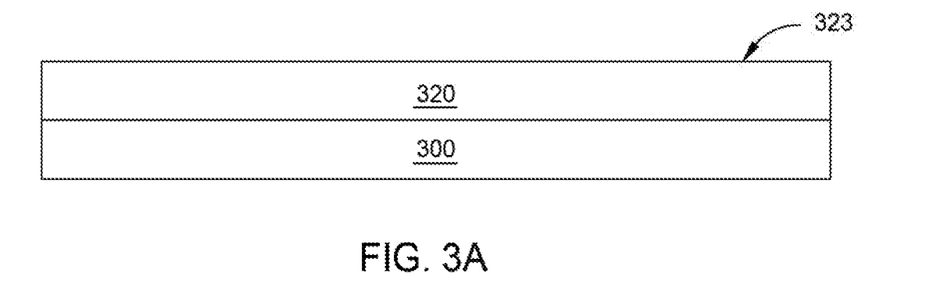
FIGS. 3A-3G illustrate cross-sectional views of a structure formed at different intervals by the process depicted in FIG. 2 in accordance with one or more embodiments described and discussed herein.

The process 200 starts at block 202 by forming a sacrificial structural layer 320 on a substrate 300, as shown in FIG. 3A. The sacrificial structural layer 320 has an upper surface 323. The sacrificial structural layer 320 may be a silicon-based material such as silicon oxide, silicon nitride, silicon oxynitride, silicon carbides, or polysilicon. It is contemplated that the choice of materials used for the sacrificial structural layer 320 may vary depending upon the etching/ashing rate relative to the resist layer to be formed thereon.

While the substrate 300 is illustrated as a single body, the substrate 300 may contain one or more materials used in forming semiconductor devices such as metal contacts, trench isolations, gates, bitlines, or any other interconnect features. The substrate 300 may be a material or a layer stack comprising one or more of the following: crystalline silicon, silicon oxide, silicon oxynitride, silicon nitride, strained silicon, silicon germanium, tungsten, titanium nitride, doped or undoped polysilicon, doped or undoped silicon wafers, silicon on insulator (SOI), carbon doped silicon oxides, silicon nitrides, germanium, gallium arsenide, glass, sapphire, low k dielectrics, and any combinations thereof. In embodiments where a memory application is desired, the substrate 300 may include the silicon substrate material, an oxide material, and a nitride material, with or without polysilicon sandwiched in between.

Figure 3B:
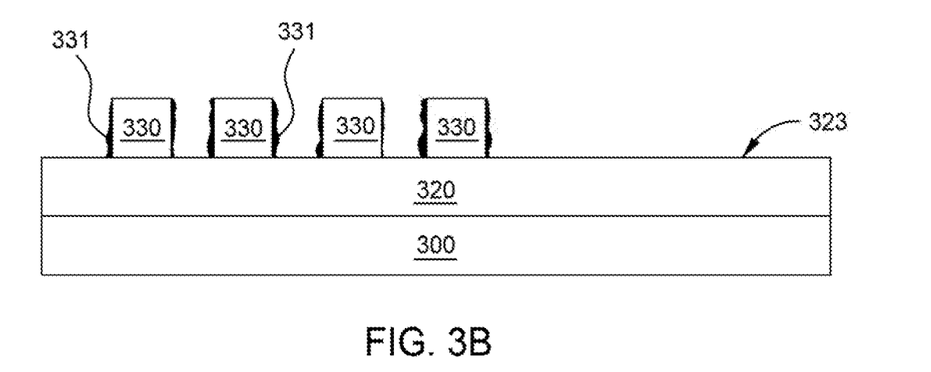

At block 204, a photoresist layer 330, such as a photoresist material, is deposited on a portion of the upper surface 323 of the sacrificial structural layer 320 and patterned with a desired pitch, as depicted in FIG. 3B. Surfaces 331 of the photoresist layer 330, such as the sidewalls between each of the segments of the photoresist layer 330, are typically very rough, wavy, or otherwise uneven after being etched.

Figure 3C:
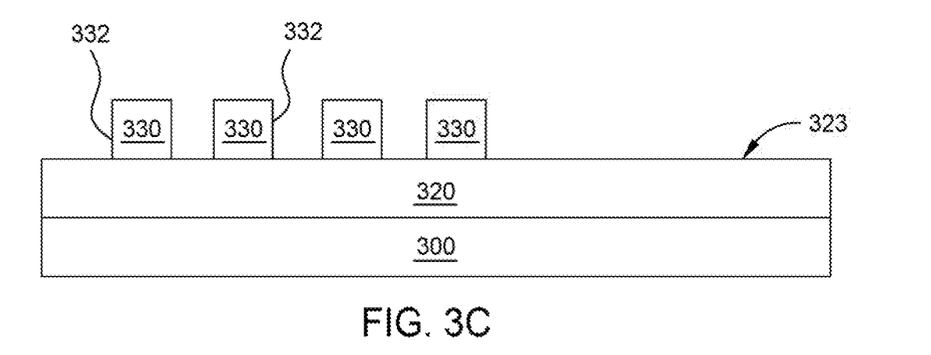

At block 206, the photoresist layer 330 is trimmed by a plasma process to modify the photoresist profile and to modulate the critical dimension (CD). Once trimmed, the photoresist layer 330 has smooth, straight, or otherwise even surfaces 332, such as sidewalls each of the segments of the photoresist layer 330, as depicted in FIG. 3C. The upper surface 323 of the sacrificial structural layer 320 extends between neighboring surfaces 332, as well as extends to the outer edges of the substrate 300. The plasma process can be conducted in the same plasma-enhanced CVD (PE-CVD) chamber as any other the deposition processes described and discussed herein.

Plasma is generated in continuous mode using various sources like radio frequency (RF), microwave, ECR, or combinations thereof and the plasma course can be or include capacitively coupled plasma (CCP) or inductively coupled plasma (ICP). The plasma source can be either a continuous plasma or a pulsed plasma. The plasma can be generated with a frequency from about 100 kHz to about 2.4 GHz and a power from about 10 watt to about 1,000 watt. The duty cycle of the plasma can be from about 3% to 100%. The processing chamber can have an internal chamber pressure from about 10 mTorr to about 50 Torr. One or more process gases and/or carrier gases can be activated by the plasma and exposed to the photoresist layer 330 during the trimming process. Exemplary process gases can be or include hydrogen ($H_2$), ammonia ($NH_3$), hydrazine ($N_2H_4$), nitrous oxide ($N_2O$), oxygen ($O_2$), one or more hydrocarbons (e.g., methane ($CH_4$), ethene ($C_2H_4$), ethyne ($C_2H_2$)), nitrogen trifluoride ($NF_3$), chlorine ($Cl_2$), nitrogen ($N_2$), carbon dioxide ($CO_2$), carbon monoxide (CO), water or steam ($H_2O$), ions thereof, plasmas thereof, or any combination thereof. Exemplary carrier gases can be or include argon (Ar), helium (He), neon (Ne), nitrogen ($N_2$), or any combination thereof.

In one or more examples, a photoresist (PR) layer with an uneven (e.g., wavy or rough) PR profile with a mushroom head can be trimmed to have a straight or slightly tapered PR profile. In some examples, the plasma process for trimming the PR can be performed with the following conditions: internal chamber pressure of about 5 Torr, plasma is RF CCP with a frequency of about 13.56 MHz, plasma power of about 200 watt, and a plasma duty cycle of about 20%. In other examples, the plasma process for trimming the PR can be performed with the following conditions: internal chamber pressure of about 0.5 Torr, plasma is RF ICP with a frequency of about 2.4 GHz, plasma power of about 500 watt, and a plasma duty cycle of about 100%.

During the plasma process, the PR profile is modulated and the desired CD is achieved. The PR trim profile tuning helps to improve the line width roughness and the line edge roughness on surfaces 332. In one or more embodiments, each of the line width roughness and the line edge roughness on surfaces 332 can independently be about 10 Å, about 12 Å, or about 15 Å to about 16 Å, about 18 Å, or about 20 Å. For example, each of the line width roughness and the line edge roughness on surfaces 332 can independently be about 10 Å to about 20 Å, about 10 Å to about 18 Å, about 10 Å to about 16 Å, about 10 Å to about 15 Å, about 12 Å to about 20 Å, about 12 Å to about 18 Å, about 12 Å to about 16 Å, about 12 Å to about 15 Å, about 15 Å to about 20 Å, about 15 Å to about 18 Å, or about 15 Å to about 16 Å. This profile tuning helps to implement spacer on spacer multiple patterning techniques on next generation leading edge semiconductor devices.

Figure 3D:
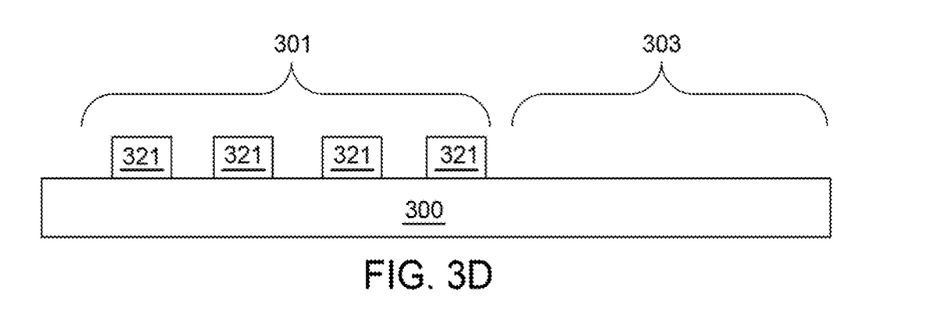

In one or more embodiments, at block 208, one or more suitable photolithography and etching processes are performed, using the photoresist layer 330 as a mask, to form patterned features 321 from the sacrificial structural layer 320 on the substrate 300. The patterned features 321 can have an aspect ratio of about 1:1 to about 50:1, for example about 2:1 to about 20:1, about 3:1 to about 10:1, or about 4:1 to about 8:1. The term "aspect ratio" in this disclosure refers to the ratio of the height dimension to the width dimension of the patterned feature.

The patterned features 321 on the substrate 300 provide a patterned area 301, while the open region having no patterned features 321 provides a blanket area 303, as shown in FIG. 3D. The patterned features 321 may be used for forming, for example, gate stack or interconnect such as vias or trenches. The patterned features 321 are sometimes referred to as placeholders, mandrels or cores and have specific line width and/or spacing based upon the photoresist material used. The width of the patterned features 321 may be adjusted by subjecting the photoresist layer 330 to a trimming process. After the pattern has been transferred into the sacrificial structural layer 320, any residual photoresist and hard mask material (if used) are removed using a suitable photoresist stripping process.

In other embodiments, the photolithography and etching processes at block 208 can be omitted and one or more dielectric layers can be deposited conformally directly on and over the photoresist layer 330 forming patterned features (not shown). These patterned features can have an aspect ratio of about 1:1 to about 50:1, for example about 3:1 to about 10:1.

Figure 3E:
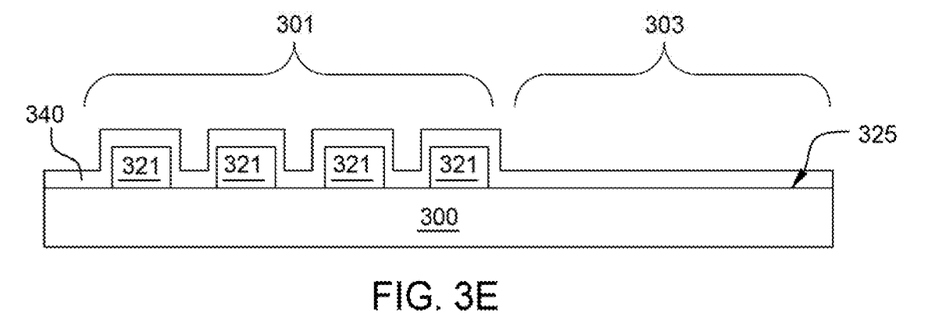

At block 210, a dielectric layer 340 is deposited conformally on the patterned features 321 (patterned area 301) and the exposed upper surface 325 of the substrate 300 (blanket area 303), as shown in FIG. 3E. The dielectric layer 340, when deposited using improved process conditions to be discussed below, will achieve good step coverage with substantially zero pattern loading across the surface of the substrate 300. For example, the percentage of film thickness between different surfaces of the characteristic difference is less than 3%. Typically, pattern loading is high for thermal CVD process, where the deposited layer is often thicker in blanket areas than areas having densely packed patterned features. This is due partly to the differences in exposed surface area of the substrate and mass-dominated reaction related to the supply of reactants. The patterned area, e.g., patterned area 301, has a larger deposition surface than an open or blanket area, e.g., blanket area 303, on which the dielectric layer 340 is deposited. In some cases, the patterned area 301 may have an exposed vertical surface greater than the blanket area 303 by a multiplicative factor greater than 2, such as about 3, about 4, about 5, about 8, about 10, about 15, about 20, or greater. The differences in exposed surface area of the substrate can cause the deposition rate to vary between the patterned area 301 and blanket area 303.

In spacer applications, since feature CD is determined by the thickness of the spacer, the pattern loading will lead to a CD variation at different locations. The improved process conditions of the present disclosure allow the dielectric layer 340 to be deposited at substantially the same deposition/reaction rate across the patterned area 301 and the blanket area 303 of the substrate 300. Because the deposition/reaction rate is the same for both the patterned area 301 and the blanket area 303, the variation in the film thickness between these areas is zero, or can be reduced to a minimum. As a result, the dielectric layer 340 can be conformally formed or otherwise deposited over patterned area 301 and blanket area 303 with zero pattern loading.

The dielectric layer 340 that can benefit from the present disclosure includes silicon-containing dielectric material, such as silicon oxide, silicon oxynitride, or silicon nitride. The dielectric layer 340 may be carbon doped, hydrogen doped, and/or contain other compounds or elements (such as n-type or p-type dopants) to tailor film properties. In some embodiments, the dielectric layer 340 can be a carbon-based material, such as an amorphous carbon (a-C) layer.

The deposition of the dielectric layer 340 is performed in a processing chamber by exposing the substrate to a deposition precursor at low temperatures. In some embodiments, a tuning gas, which is a chemical reaction by-product in the deposition process of the dielectric layer 340, is flowed concurrently (e.g., co-flow mode) with the deposition precursor during deposition of the dielectric layer 340. No plasma excitation is present in the substrate processing region during the deposition process. The deposition precursor can be one or more of any suitable precursors depending upon the application. In embodiments where a silicon-containing dielectric material is desired, the deposition precursor can include a silicon-containing precursor. The processing chamber may be a CVD chamber or any suitable thermal processing chamber.

Suitable silicon-containing precursor may include silanes, halogenated silanes, organosilanes, and any combinations thereof. Silanes may include silane ($SiH_4$) and higher silanes with the empirical formula $Si_xH_{(2x+2)}$, where x=1-20. Exemplary silanes can be or include disilane ($Si_2H_6$), trisilane ($Si_3H_8$), and tetrasilane ($Si_4H_{10}$), or other higher order silanes, one or more chlorosilanes, such as a polychlorosilane, or any combination thereof. Other silicon-containing precursor, such as octamethylcyclotetrasiloxane (OMCTS), methyldiethoxysilane (MDEOS), bis(tertiary-butylamino) silane (BTBAS), tris(dimethylamino)silane (TrisDMAS), tetrakis(dimethylamino)silane (TetraDMAS), tris(diethylamino)silane (TrisDEAS), tetrakis(diethylamino)silane (TetraDEAS), dichlorosilane, trichlorosilane, dibromosilane, silicon tetrachloride, silicon tetrabromide, or combinations thereof, or organosilicon compounds having a ratio of oxygen to silicon atoms of 0 to about 6, may also be used. Suitable organosilicon compounds may be siloxane compounds, halogenated siloxane compounds that include one or more halogen moieties (e.g., fluoride, chloride, bromide, or iodide), such as tetrachlorosilane, dichlorodiethoxysiloxane, chlorotriethoxysiloxane, hexachlorodisiloxane, and/or octachlorotrisiloxane, and aminosilanes, such as trisilylamine (TSA), hexamethyldisilazane (HMDS), silatrane, tetrakis(dimethylamino)silane, bis(diethylamino)silane, tris(dimethyl-amino)chlorosilane, methylsilatrane, or any combination thereof.

In embodiments where the dielectric layer 340 is a carbon-based material, the deposition precursor may be a carbon-containing precursor such as hydrocarbon compounds. The hydrocarbon compounds may be partially or completely doped derivatives of hydrocarbon compounds, including fluorine-, oxygen-, hydroxyl group-, and boron-containing derivatives of hydrocarbon compounds. Suitable hydrocarbon compounds may include one or more of the following compounds, for example, alkanes such as methane ($CH_4$), ethane ($C_2H_6$), propane ($C_3H_8$), butane ($C_4H_{10}$) and its isomer isobutane, pentane ($C_5H_{12}$) and its isomers isopentane and neopentane, hexane ($C_6H_{14}$) and its isomers 2-methylpentance, 3-methylpentane, 2,3-dimethylbutane, and 2,2-dimethyl butane, isomers thereof, derivatives thereof, or any combination thereof. Additional suitable hydrocarbons may include alkenes such as ethylene, propylene, butylene and its isomers, pentene and its isomers, and the like, dienes such as butadiene, isoprene, pentadiene, hexadiene and the like, and halogenated alkenes include monofluoroethylene, difluoroethylenes, trifluoroethylene, tetrafluoroethylene, monochloroethylene, dichloroethylenes, trichloroethylene, tetrachloroethylene, and the like.

Also, alkynes such as acetylene ($C_2H_2$), propyne ($C_3H_4$), butyne ($C_4H_6$), vinylacetylene and derivatives thereof can be used as carbon precursors. Additional cyclic hydrocarbons, such as benzene, styrene, toluene, xylene, ethylbenzene, acetophenone, methyl benzoate, phenyl acetate, phenylacetylene ($C_8H_6$), phenol, cresol, furan, alpha-terpinene, cymene, 1,1,3,3-tetramethylbutylbenzene, t-butylether, t-butylethylene, methyl-methacrylate, and t-butylfurfurylether, compounds or radicals having the formula $C_3H_2$ and/or $C_5H_4$, halogenated aromatic compounds including monofluorobenzene, difluorobenzenes, tetrafluorobenzenes, hexafluorobenzene and the like can be used. Halogenated hydrocarbons such as carbon tetrachloride ($CCl_4$), diiodomethane ($CH_2I_2$), one or more chlorofluorocarbons (CFCs), bromotrichloromethane ($BrCCl_3$), 1,1-dichloroethylene, bromobenzene, or derivatives thereof may also be used.

The tuning gas, as discussed above, is a chemical reaction by-product in the deposition process of the dielectric layer 340. Therefore, the tuning gas is chosen depending on the deposition process and chemistry used for the deposition precursor. The tuning gas may or may not participate in the chemical reaction. In embodiments where the deposition precursor is a silicon-containing precursor using silane, the substrate is exposed to the deposition precursor and the tuning gas, and the deposition precursor is reacted to form a chemical reaction by-product. In such a case, the chemical reaction by-product is the same as the tuning gas. For example, in an exemplary reaction of $SiH_4 + 2O_2 \rightarrow SiO_2 + 2H_2O$, the product is $SiO_2$ and water ($H_2O$), and the by-product may include hydrogen gas ($H_2$). In this case, the tuning gas can be or include hydrogen gas.

In embodiments where the deposition precursor is or includes a silicon-containing precursor, the flow rate for the silicon-containing precursor is controlled to provide a partial pressure of the silicon-containing precursor in the processing chamber. The partial pressure of the deposition precursor in the processing chamber is an indicator of the concentration of the reacted precursors residing at or near the surface of the substrate. In embodiments where a 300 mm substrate is used, the silicon-containing precursor may be provided at a flow rate of about 10 sccm to about 10,000 sccm, such as about 20 sccm to about 5,000 sccm, for example about 50 sccm to about 2,000 sccm. The flow rate may be adjusted so that the partial pressure of the silicon-containing precursor is controlled in a range from about 10 Torr to about 100 Torr, for example about 20 Torr to about 90 Torr, about 40 Torr to about 80 Torr, or about 40 Torr to about 60 Torr. The partial pressure of the silicon-containing precursor may be greater (e.g., 100 Torr or above) so long as the partial pressure of the silicon-containing precursor does not negatively impact the mean free path length of the gas molecules and thus affect the diffusivity of precursors into the trenches between the patterned features 321.

Similarly, the flow rate for the tuning gas is controlled to provide a partial pressure of the tuning gas in the processing chamber. The tuning gas may be provided at about the same flow rate as the deposition precursor. The flow rate may be adjusted so that the partial pressure of the tuning gas is controlled in a range from about 10 Torr to about 100 Torr, for example about 20 Torr to about 90 Torr, about 40 Torr to about 80 Torr, or about 40 Torr to about 60 Torr. In various embodiments where the silicon-containing precursor and the tuning gas are co-flowed into the processing chamber, the tuning gas and the silicon-containing precursor may be provided at a volumetric flow ratio (tuning gas:silicon-containing precursor) of about 1:2 to about 1:6, for example about 1:4.

In some embodiments, no carrier/inert gases are used during the deposition process. In such cases, the chamber pressure can be substantially identical to the partial pressure of the silicon-containing precursor, or the combined pressure of the deposition precursor and the tuning gas. In any case, the flow rate and the increased partial pressure of the precursor/tuning gas enable the precursor/gas to diffuse or penetrate into the bottom of the trench between the patterned features 321.

In some cases, carrier gases may be used to carry the silicon-containing precursor to the processing chamber. In some cases, inert gases may be used to help maintain the processing chamber at a particular pressure. In some cases, dilution gases may be used to control the density and deposition rate of the dielectric layer 340. Suitable carrier/inert/dilution gases may include helium, argon, hydrogen ($H_2$), ammonia, nitrogen ($N_2$), krypton, xenon, or any combinations thereof. In some cases, a p-type or n-type dopant gas, such as diborane ($B_2H_6$), phosphine ($PH_3$), arsine ($AsH_3$), or any combination thereof, may be used during the deposition process. In any case, the combination of the precursors (e.g., deposition and tuning gas) and the gases of carrier/inert/dilution or dopant gases can be used to set the total pressure of the processing chamber.

The total pressure can be about 20 Torr, about 30 Torr, about 50 Torr, about 80 Torr, or about 100 Torr to about 150 Torr, about 200 Torr, about 250 Torr, about 300 Torr, about 400 Torr, about 500 Torr, about 600 Torr, or greater. For example, the total pressure can be in a range of about 20 Torr to about 600 Torr, about 20 Torr to about 500 Torr, about 20 Torr to about 400 Torr, about 20 Torr to about 300 Torr, about 20 Torr to about 200 Torr, about 20 Torr to about 100 Torr, about 20 Torr to about 50 Torr, about 50 Torr to about 600 Torr, about 50 Torr to about 500 Torr, about 50 Torr to about 400 Torr, about 50 Torr to about 300 Torr, about 50 Torr to about 200 Torr, about 50 Torr to about 100 Torr, about 50 Torr to about 80 Torr, about 100 Torr to about 600 Torr, about 100 Torr to about 500 Torr, about 100 Torr to about 400 Torr, about 100 Torr to about 300 Torr, about 100 Torr to about 200 Torr, or about 100 Torr to about 150 Torr.

During the deposition process, the substrate 300 may be maintained at a temperature of about 550° C. or below, for example about 500° C. or below, such as about 250° C. to about 480° C. In one or more examples, the substrate 300 is maintained at a temperature of about 350° C. to about 450° C. The substrate 300 may be spaced about 50 mils, about 80 mils, or about 100 mils to about 120 mils, about 150 mils, about 200 mils, about 250 mils, or about 300 mils from a showerhead faceplate where the precursors and/or gases enter the processing chamber. When the precursor/tuning gas are kept at a constant flow, the spacing between the substrate and the showerhead faceplate can be controlled to increase the gas velocity, which in turn helps diffusion of the precursors into the bottom of the trench between the patterned features 321. In one or more embodiments, the flow rate and the spacing may be controlled so that the precursor/tuning gas are flowed at a rate of about 0.1 L/minute to 1 L/minute. In any case, the partial pressure, substrate temperature, and flow parameters may be adjusted such that the dielectric layer 340 is deposited at a rate of about 1 Å/min to about 600 Å/min, for example about 2 Å/min to about 50 Å/min.

The deposited dielectric layer 340 may have a thickness of about 50 Å, about 80 Å, about 100 Å, or about 120 Å to about 150 Å, about 200 Å, about 250 Å, about 300 Å, about 400 Å, about 500 Å, or about 600 Å. For example, the deposited dielectric layer 340 may have a thickness of about 50 Å to about 600 Å, about 50 Å to about 500 Å, about 50 Å to about 400 Å, about 50 Å to about 300 Å, about 50 Å to about 250 Å, about 50 Å to about 200 Å, about 50 Å to about 150 Å, about 50 Å to about 100 Å, about 100 Å to about 600 Å, about 100 Å to about 500 Å, about 100 Å to about 400 Å, about 100 Å to about 300 Å, about 100 Å to about 250 Å, about 100 Å to about 200 Å, about 100 Å to about 150 Å, about 200 Å to about 600 Å, about 200 Å to about 500 Å, about 200 Å to about 400 Å, about 200 Å to about 300 Å, or about 200 Å to about 250 Å.

It is noted that the process conditions described herein can be modified for processing substrates with different sizes. The above process conditions are applicable to other deposition precursor such as the carbon-containing precursor, or can be modified depending upon the material of the dielectric layer 340. An ordinary skill in the art can modify the flow rates and/or other parameters to deposit a desired dielectric layer.

Increasing partial pressure of the one or more deposition precursors and the tuning gas allows the deposition process to proceed in a saturation regime, which means the deposition precursor and the tuning gas are provided at an amount that is more than required for a deposition reaction to occur at the patterned area 301 and the blanket area 303. In one or more embodiments, the deposition precursor and the tuning gas are provided at an amount that is at least 20% or more, for example about 50% to about 300%, greater than the amount of the deposition precursor and the tuning gas that can be consumed at the patterned area 301 and the blanket area 303. In other words, the patterned area 301 and blanket area 303 are exposed to excessive amount of the deposition precursor and the tuning gas. Without being bounded by any particular theory, the saturation regime can result in a decreased variation in the thickness between the patterned area 301 and blanket area 303 since the supply of the deposition precursor and the tuning gas is much higher than the consumption of the precursors in both the patterned area 301 and blanket area 303. Since higher concentration of the deposition precursor can lead to an increase of the deposition rate and higher concentration of the tuning gas (e.g., the chemical reaction by-product of the deposition process) can lead to a decrease of the deposition rate at a given temperature, the saturation regime will allow the concentration of the deposition precursor and the concentration of the tuning gas to maintain at the same level across the patterned area 301 and the blanket area 303. Therefore, the deposition rate between the patterned area 301 and blanket area 303 will be substantially identical, thereby achieving reduced, or substantial zero pattern loading for a thermal CVD process.

Figure 3F:
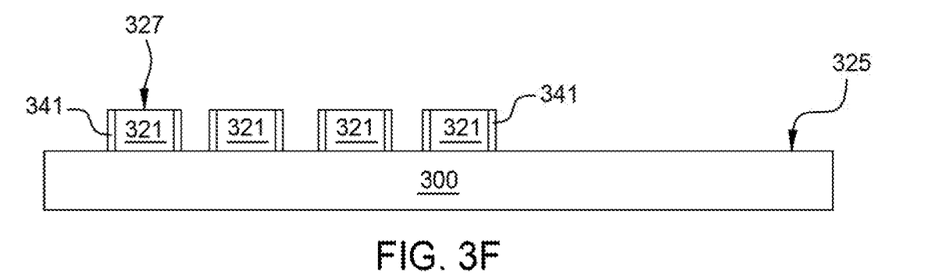

At block 212, after the dielectric layer 340 has been deposited conformally on the patterned features 321 using the improved deposition process discussed at block 210, a portion of the dielectric layer 340 is anisotropically etched (a vertical etch), leaving the dielectric layer 340 (or at least a portion thereof) on sidewalls of the patterned features 321. Particularly, the dielectric layer 340 on an upper surface 327 of the patterned features 321 and the dielectric layer 340 on the exposed surface of the substrate 300 (e.g., the blanket area 303) are removed to expose the upper surface 327 of patterned features 321 and the upper surface 325 of the substrate 300. The remaining dielectric layer 340 thus forms sidewall spacers 341 and protects the sidewall of the patterned features 321, as shown in FIG. 3F. Due to the improved deposition process of the dielectric layer 340, the sidewall spacers 341 as formed can have a uniform thickness across the substrate surface and provide a constant CD for multi-patterning applications.

Figure 3G:
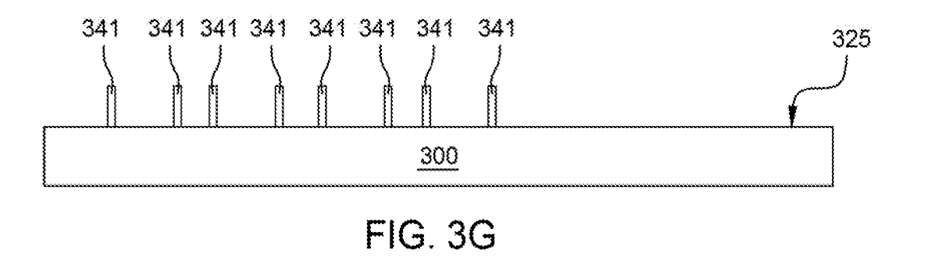

At block 214, the patterned features 321 are removed using a plasma etching process or other suitable wet stripping process, leaving the sidewall spacers 341 disposed across the upper surface 325 of the substrate 300, as shown in FIG. 3G. The plasma etching process may be performed by bringing the substrate 300 in contact with a plasma generated from a fluorine-based etching chemistry to remove the patterned features 321. The etching chemistry is selective so that the sidewall spacers 341 do not get damaged during the etching/stripping process. Upon removal of the patterned features 321, the sidewall spacers 341 may be used as a hardmask for etching the underlying layer, layer stack, or structure.

In summary, embodiments of the present disclosure provide methods for processing substrates. In one or more embodiments, a method is provided a includes trimming photoresist to provide photoresist profiles with smooth sidewall surfaces and to tune or modulate critical dimensions (CD) for the patterned features and/or a subsequently deposited dielectric layer. The method can include depositing a sacrificial structure layer on the substrate, depositing a photoresist on the sacrificial structure layer, and patterning the photoresist to produce a crude photoresist profile on the sacrificial structure layer. The method also includes trimming the photoresist with a plasma to produce a refined photoresist profile covering a first portion of the sacrificial structure layer while a second portion of the sacrificial structure layer is exposed, etching the second portion of the sacrificial structure layer to form patterned features disposed on the substrate, and depositing a dielectric layer on the patterned features. In some examples, trimming the photoresist and depositing the dielectric layer occur in the same processing chamber, such as a PE-CVD chamber.

Embodiments of the present disclosure further relate to any one or more of the following paragraphs 1-16:

1. A method for processing a substrate, comprising: depositing a sacrificial structure layer on the substrate; depositing a photoresist on the sacrificial structure layer; patterning the photoresist to produce a crude photoresist profile on the sacrificial structure layer; trimming the photoresist with a plasma to produce a refined photoresist profile covering a first portion of the sacrificial structure layer while a second portion of the sacrificial structure layer is exposed; etching the second portion of the sacrificial structure layer to form patterned features disposed on the substrate; and depositing a dielectric layer on the patterned features.

2. A method for processing a substrate, comprising: depositing a sacrificial structure layer on the substrate; depositing a photoresist on the sacrificial structure layer; patterning the photoresist to produce a crude photoresist profile on the sacrificial structure layer; trimming the photoresist with a plasma to produce a refined photoresist profile covering a first portion of the sacrificial structure layer while a second portion of the sacrificial structure layer is exposed, wherein the refined photoresist profile has a line width roughness of about 10 Å to about 20 Å and a line edge roughness of about 10 Å to about 20 Å; etching the second portion of the sacrificial structure layer to form patterned features disposed on the substrate; and depositing a dielectric layer on the patterned features, wherein trimming the photoresist and depositing the dielectric layer occur in the same processing chamber.

3. A method for processing a substrate, comprising: depositing a sacrificial structure layer on the substrate;

depositing a photoresist on the sacrificial structure layer; patterning the photoresist to produce a crude photoresist profile on the sacrificial structure layer; trimming the photoresist with a plasma to produce a refined photoresist profile covering a first portion of the sacrificial structure layer while a second portion of the sacrificial structure layer is exposed, wherein the refined photoresist profile has a line width roughness of about 10 Å to about 20 Å and a line edge roughness of about 10 Å to about 20 Å; etching the second portion of the sacrificial structure layer to form patterned features disposed on the substrate; removing the photoresist from the patterned features; and depositing a dielectric layer on the patterned features.

4. The method according to any one of paragraphs 1-3, wherein the refined photoresist profile contains sidewall surfaces with smoother or less wavy surfaces than sidewall surfaces of the crude photoresist profile.

5. The method according to any one of paragraphs 1-4, wherein trimming the photoresist further comprises modulating a critical dimension for the patterned features or the subsequently deposited dielectric layer.

6. The method according to any one of paragraphs 1-5, wherein the refined photoresist profile has a line width roughness of about 10 Å to about 20 Å.

7. The method according to any one of paragraphs 1-6, wherein the refined photoresist profile has a line edge roughness of about 10 Å to about 20 Å.

8. The method according to any one of paragraphs 1-7, wherein trimming the photoresist and depositing the dielectric layer occur in the same processing chamber.

9. The method according to any one of paragraphs 1-8, wherein the processing chamber is a plasma-enhanced chemical vapor deposition (PE-CVD) chamber.

10. The method according to any one of paragraphs 1-9, wherein the plasma is a capacitively coupled plasma (CCP).

11. The method according to any one of paragraphs 1-10, wherein the plasma is an inductively coupled plasma (ICP).

12. The method according to any one of paragraphs 1-11, wherein the plasma is generated with a frequency in a range from about 100 kHz to about 2.4 GHz.

13. The method according to any one of paragraphs 1-12, wherein the plasma is generated with a power in a range from about 10 watt to about 1,000 watt.

14. The method according to any one of paragraphs 1-13, wherein the plasma is generated in a processing chamber having a pressure in a range from about 10 mTorr to about 50 Torr.

15. The method according to any one of paragraphs 1-14, wherein trimming the photoresist further comprises exposing the photoresist to a process gas comprising hydrogen ($H_2$), ammonia, nitrous oxide, oxygen ($O_2$), a hydrocarbon, nitrogen trifluoride, chlorine ($Cl_2$), nitrogen ($N_2$), carbon dioxide, carbon monoxide, water, ions thereof, plasmas thereof, or any combination thereof.

16. The method according to any one of paragraphs 1-15, further comprising removing the photoresist from the patterned features before depositing the dielectric layer on the patterned features.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

The invention claimed is:

1. A method for processing a substrate, comprising:
depositing a sacrificial structure layer on the substrate, wherein the substrate is a doped or undoped silicon wafer or a sapphire;
depositing a photoresist on the sacrificial structure layer;
patterning the photoresist to produce a crude photoresist profile on the sacrificial structure layer;
trimming the photoresist with a plasma to produce a refined photoresist profile covering a first portion of the sacrificial structure layer while a second portion of the sacrificial structure layer is exposed, wherein the refined photoresist profile has a line width roughness of about 10 Å to about 20 Å and a line edge roughness about 10 Å to about 20 Å;
etching the second portion of the sacrificial structure layer to form patterned features disposed on the substrate;
depositing a dielectric layer on upper surfaces and side surfaces of the patterned features and on and in contact with an upper surface of the substrate, wherein trimming the photoresist and depositing the dielectric layer occur in the same processing chamber;
anisotropically etching a portion of the dielectric layer, comprising:
removing the dielectric layer on the upper surfaces of the patterned features;
removing the dielectric layer on the upper surface of the substrate; and
leaving at least a portion of the dielectric material on the side surfaces, wherein the portion of the dielectric material on the side surfaces forms sidewall spacers disposed on the upper surface of the substrate; and
removing the patterned features while leaving the sidewall spacers disposed across and in contact with the upper surface of the substrate.

2. The method of claim 1, wherein the refined photoresist profile contains sidewall surfaces with smoother or less wavy surfaces than sidewall surfaces of the crude photoresist profile.

3. The method of claim 1, wherein trimming the photoresist further comprises modulating a critical dimension for the patterned features or the subsequently deposited dielectric layer.

4. The method of claim 1, wherein the dielectric layer comprises silicon oxide, silicon oxynitride, or silicon nitride, and wherein the dielectric layer is doped with carbon or hydrogen.

5. The method of claim 1, wherein the processing chamber is a plasma-enhanced chemical vapor deposition chamber.

6. The method of claim 1, wherein the plasma is a capacitively coupled plasma (CCP) or an inductively coupled plasma (ICP), and wherein the dielectric layer is a carbon-based material comprising amorphous carbon.

7. The method of claim 1, wherein the plasma is generated with a frequency in a range from about 100 kHz to about 2.4 GHz and a power in a range from about 10 watt to about 1,000 watt.

8. The method of claim 1, wherein the plasma is generated in a processing chamber having a pressure in a range from about 10 mTorr to about 50 Torr.

9. The method of claim 1, wherein trimming the photoresist further comprises exposing the photoresist to a process gas comprising hydrogen ($H_2$), ammonia, nitrous oxide, oxygen ($O_2$), a hydrocarbon, nitrogen trifluoride, chlorine ($Cl_2$), nitrogen ($N_2$), carbon dioxide, carbon monoxide, water, ions thereof, plasmas thereof, or any combination thereof.

10. The method of claim 1, further comprising removing the photoresist from the patterned features before depositing the dielectric layer on the patterned features.

11. A method for processing a substrate, comprising:
depositing a sacrificial structure layer on the substrate, wherein the substrate is a doped or undoped silicon wafer or a sapphire;
depositing a photoresist on the sacrificial structure layer;
patterning the photoresist to produce a crude photoresist profile on the sacrificial structure layer;
trimming the photoresist with a plasma to produce a refined photoresist profile covering a first portion of the sacrificial structure layer while a second portion of the sacrificial structure layer is exposed, wherein the refined photoresist profile has a line width roughness of about 10 Å to about 20 Å and a line edge roughness of about 10 Å to about 20 Å;
etching the second portion of the sacrificial structure layer to form patterned features disposed on the substrate;
depositing a dielectric layer on upper surfaces and side surfaces of the patterned features and on and in contact with an upper surface of the substrate, wherein trimming the photoresist and depositing the dielectric layer occur in the same processing chamber;
anisotropically etching a portion of the dielectric layer, comprising:
removing the dielectric layer on the upper surfaces of the patterned features;
removing the dielectric layer on the upper surface of the substrate; and
leaving at least a portion of the dielectric material on the side surfaces,
wherein the portion of the dielectric material on the side surfaces forms sidewall spacers disposed on the upper surface of the substrate; and
removing the patterned features while leaving the sidewall spacers disposed across and in contact with the upper surface of the substrate.

12. The method of claim 11, wherein the refined photoresist profile contains sidewall surfaces with smoother or less wavy surfaces than sidewall surfaces of the crude photoresist profile.

13. The method of claim 11, wherein trimming the photoresist further comprises modulating a critical dimension for the subsequently deposited dielectric layer.

14. The method of claim 11, wherein the processing chamber is a plasma-enhanced chemical vapor deposition chamber.

15. The method of claim 11, wherein the plasma is a capacitively coupled plasma (CCP) or an inductively coupled plasma (ICP).

16. The method of claim 11, wherein the plasma is generated with a frequency in a range from about 100 kHz to about 2.4 GHz and a power in a range from about 10 watt to about 1,000 watt.

17. The method of claim 11, wherein the plasma is generated in a processing chamber having a pressure in a range from about 10 mTorr to about 50 Torr.

18. The method of claim 11, wherein trimming the photoresist further comprises exposing the photoresist to a process gas comprising hydrogen ($H_2$), ammonia, nitrous oxide, oxygen ($O_2$), a hydrocarbon, nitrogen trifluoride, chlorine ($Cl_2$), nitrogen ($N_2$), carbon dioxide, carbon monoxide, water, ions thereof, plasmas thereof, or any combination thereof.

19. A method for processing a substrate, comprising:
depositing a sacrificial structure layer on the substrate, wherein the substrate is a doped or undoped silicon wafer or a sapphire;
depositing a photoresist on the sacrificial structure layer;
patterning the photoresist to produce a crude photoresist profile on the sacrificial structure layer;
trimming the photoresist with a plasma to produce a refined photoresist profile covering a first portion of the sacrificial structure layer while a second portion of the sacrificial structure layer is exposed, wherein the refined photoresist profile has a line width roughness of about 10 Å to about 20 Å and a line edge roughness of about 10 Å to about 20 Å;
etching the second portion of the sacrificial structure layer to form patterned features disposed on the substrate;
removing the photoresist from the patterned features;
depositing a dielectric layer on upper surfaces and side surfaces of the patterned features and on and in contact with an upper surface of the substrate, wherein the dielectric layer comprises silicon oxide, silicon oxynitride, or silicon nitride, and wherein the dielectric layer is doped with carbon or hydrogen;
anisotropically etching a portion of the dielectric layer, comprising:
removing the dielectric layer on the upper surfaces of the patterned features;
removing the dielectric layer on the upper surface of the substrate; and
leaving at least a portion of the dielectric material on the side surfaces,
wherein the portion of the dielectric material on the side surfaces forms sidewall spacers disposed on the upper surface of the substrate; and
removing the patterned features while leaving the sidewall spacers disposed across and in contact with the upper surface of the substrate.

* * * * *